(12) United States Patent
Imai et al.

(10) Patent No.: US 9,906,217 B2
(45) Date of Patent: Feb. 27, 2018

(54) FET GATE STABILIZING CIRCUIT

(71) Applicant: Mitsubishi Electric Corporation, Tokyo (JP)

(72) Inventors: Shohei Imai, Tokyo (JP); Kazuya Yamamoto, Tokyo (JP); Yoshinobu Sasaki, Tokyo (JP); Shinichi Miwa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 82 days.

(21) Appl. No.: 15/173,745

(22) Filed: Jun. 6, 2016

(65) Prior Publication Data

US 2017/0126223 A1 May 4, 2017

(30) Foreign Application Priority Data

Nov. 2, 2015 (JP) .................. 2015-215710

(51) Int. Cl.

| | | |
|---|---|---|
| *H01L 29/737* | (2006.01) | |
| *H03K 17/16* | (2006.01) | |
| *H01L 27/06* | (2006.01) | |
| *H01L 29/78* | (2006.01) | |
| *H03K 17/687* | (2006.01) | |

(52) U.S. Cl.
CPC ....... *H03K 17/162* (2013.01); *H01L 27/0635* (2013.01); *H01L 29/737* (2013.01); *H01L 29/7838* (2013.01); *H03K 2017/6875* (2013.01)

(58) Field of Classification Search
CPC .......... H03K 17/162; H03K 2017/6875; H01L 27/0635; H01L 29/737; H01L 29/7838
USPC ....... 327/419, 432, 538, 542, 543, 551, 574, 327/581, 592
See application file for complete search history.

(56) References Cited

U.S. PATENT DOCUMENTS

| | | | | |
|---|---|---|---|---|
| 4,031,482 A | * | 6/1977 | Tsurushima | ............ H03F 1/305 330/264 |
| 4,763,028 A | * | 8/1988 | Henry | ..................... H03F 1/306 327/378 |
| 4,800,299 A | * | 1/1989 | Hayward | ......... H03K 19/00338 257/335 |
| 5,625,323 A | | 4/1997 | Tozawa | |
| 2009/0256628 A1 | * | 10/2009 | Ilkov | ........................ G05F 3/30 327/543 |

FOREIGN PATENT DOCUMENTS

JP  Hei8-222967 A  8/1996

* cited by examiner

*Primary Examiner* — William Hernandez
(74) *Attorney, Agent, or Firm* — Studebaker & Brackett PC

(57) ABSTRACT

A semiconductor device includes: a depletion-type field-effect transistor including a gate terminal, a drain terminal and a source terminal; a group III-V heterojunction bipolar transistor including a base terminal, an emitter terminal electrically connected to the gate terminal and a collector terminal connected to same potential as that of the source terminal; a first resistor connected between the base terminal and the emitter terminal; and a second resistor connected between the base terminal and the collector terminal.

16 Claims, 12 Drawing Sheets

FET GATE STABILIZING CIRCUIT

BACKGROUND OF THE INVENTION

Field

The present invention relates to a semiconductor device with a stabilizing circuit for suppressing unnecessary parasitic oscillation of a field-effect transistor.

Background

Semiconductor devices including an amplifier, oscillator or mixer using a field-effect transistor (hereinafter, referred to as "FET") are provided with a stabilizing circuit for suppressing unnecessary parasitic oscillation. Conventional stabilizing circuits achieve stabilization by connecting a resistor between a gate terminal of the FET and a grounding terminal (ground). Since a frequency whose oscillation is preferred to be suppressed is generally lower than a frequency of an input signal, an inductor is connected in series to the above-described resistor and it is thereby possible to achieve stabilization by preventing the input signal from being consumed at the resistor and causing a signal having a lower frequency than that of the input signal to be consumed at the resistor.

To achieve stability with the conventional stabilizing circuit, the resistance is preferably lowered. On the other hand, a DC voltage of several V needs to be applied between the gate terminal of the FET and the grounding terminal as a bias to obtain a desired characteristic of the semiconductor device. Therefore, a DC voltage of several V is applied between both ends of the resistor of the stabilizing circuit. For this reason, when the resistance is reduced to obtain stability, the current flowing through the resistor increases according to Ohm's law and power consumption increases. As a result, stability and low power consumption cannot be achieved simultaneously.

As an example, a simulation is run on a 2.6 GHz amplifier made up of GaN (gallium nitride) FET having a gate width of 4.8 mm. Note that the inductor in the stabilizing circuit is assumed to have an inductance of 0.1 nH in this analysis.

FIG. 19 is a diagram illustrating a frequency characteristic of a reflection coefficient on the transistor side including the conventional stabilizing circuit. FIG. 20 is a diagram illustrating a frequency characteristic of a maximum available gain & maximum stable gain (MAG/MSG) that can be achieved for stabilization of a transistor including the conventional stabilizing circuit. FIG. 21 is a diagram illustrating a relationship of a bias current supplied by a gate-side power supply with respect to resistance of the transistor including the conventional stabilizing circuit.

It is seen from FIG. 19 that input reflection of the transistor decreases when the resistance of a resistor $R_{stab}$ of the stabilizing circuit is decreased, and there is no reflection gain when the resistance is 1Ω. It is also seen from FIG. 20 that MAG/MSG decreases at a low frequency when the resistance is decreased, but MAG/MSG does not change in a region of a certain frequency or higher (approximately 1 GHz in FIG. 20) and MAG/MSG is independent of the resistance at 2.6 GHz which is the frequency of the input signal.

FIG. 22 is a diagram summarizing a relationship of a maximum value of a reflection coefficient with respect to each resistance in FIG. 19. It is seen from FIG. 22 that the resistance needs to be set to 4Ω or greater to achieve stability (that is, the maximum value of the reflection coefficient is equal to or less than 0 dB).

FIG. 23 is a diagram illustrating a relationship of a maximum value of a reflection coefficient with respect to a bias current obtained from the relationship between the maximum value of the reflection coefficient at each resistance and the bias current at each resistance in FIG. 19. It is seen from FIG. 23 that the bias current needs to be set to 0.3 A or greater to achieve stability in the prior art.

Furthermore, a capacitor may be connected in series to the resistor and the inductor. In this case, since no DC voltage is applied to both ends of the resistor and no DC power is consumed at the resistor, it is possible to reduce power consumption. However, if an attempt is made to achieve stability at an extremely low frequency in the vicinity of DC in this configuration, it is necessary to significantly increase the capacitance of the capacitor. Since the physical size of the capacitor also increases as its capacitance increases, it is not easy to achieve both stability and downsizing.

To deal with this problem, a method is disclosed which applies a gate voltage of a GaAs (gallium arsenide) FET while securing stability against thermal runaway using Si (silicon)-based PNP transistor and an NPN transistor (e.g., see Patent Literature 1: JP 8-222967 A). Although not clearly stated in the document of the prior art, the present configuration is one of effective measures for the above-described parasitic oscillation.

When the circuit shown in Patent Literature 1 is used as the stabilizing circuit, since the operating frequency of the Si transistor is low, stability against oscillation improves only at a low frequency of on the order of several tens of MHz, whereas improvement in stability of on the order of several hundreds of MHz cannot be expected. Moreover, since the Si transistor has large loss in a high frequency region, attenuation of the input signal is large (approximately 1 GHz or greater), causing the gain to reduce, and so it is difficult to use the Si transistor for a semiconductor device (amplifier, oscillator, mixer or the like) for several GHz. Particularly, when an amplification FET and a bias circuit Si transistor are placed in the same semiconductor package, loss in the Si transistor becomes conspicuous.

SUMMARY

The present invention has been implemented to solve the above-described problems and it is an object of the present invention to provide a semiconductor device capable of achieving both stability and low power consumption.

According to the present invention, a semiconductor device includes: a depletion-type field-effect transistor including a gate terminal, a drain terminal and a source terminal; a group III-V heterojunction bipolar transistor including a base terminal, an emitter terminal electrically connected to the gate terminal and a collector terminal connected to same potential as that of the source terminal; a first resistor connected between the base terminal and the emitter terminal; and a second resistor connected between the base terminal and the collector terminal.

The present invention provides the Vbe multiplier between the gate terminal and the source terminal of the depletion-type field-effect transistor. The Vbe multiplier includes the group III-V heterojunction bipolar transistor, the first resistor connected between the base terminal and the emitter terminal, and the second resistor connected between the base terminal and the collector terminal. This makes it possible to prevent unnecessary low-frequency oscillation while keeping the gate bias current at a low level. As a result, it is possible to achieve both stability and low power consumption.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
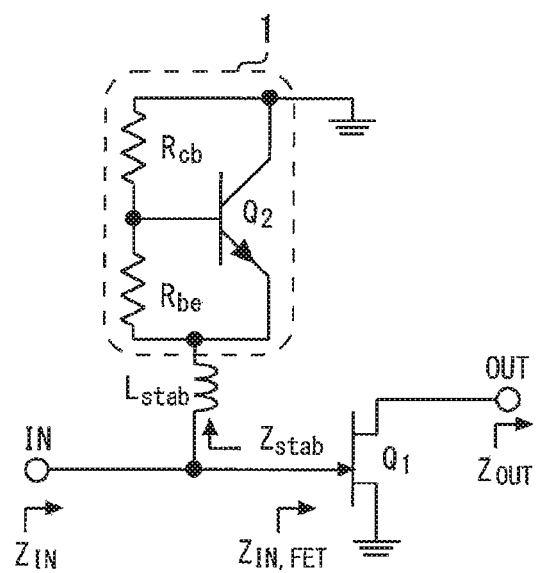
FIG. 1 is a circuit diagram illustrating a semiconductor device according to a first embodiment of the present invention.

FIG. 1 is a circuit diagram illustrating a semiconductor device according to a first embodiment of the present invention. A transistor Q1 is a depletion-type FET intended to obtain amplification operation. A source terminal of the transistor Q1 is grounded. An input matching circuit for circuit matching is connected to an input terminal IN. A gate terminal of the transistor Q1 is connected to the input terminal IN and an AC input signal and a negative DC gate bias are applied thereto via the input terminal IN. An output matching circuit for circuit matching is connected to an output terminal OUT. A drain terminal of the transistor Q1 is connected to the output terminal OUT, a positive drain bias is applied thereto via the output terminal OUT and a signal amplified by the transistor Q1 is outputted therefrom.

A stabilizing circuit 1 is connected between the gate terminal of the transistor Q1 and a grounding terminal. The stabilizing circuit 1 includes a transistor Q2 which is a GaAs-based heterojunction bipolar transistor (NPN-type) and resistors Rbe and Rcb. An emitter terminal of the transistor Q2 is electrically connected to the gate terminal of the transistor Q1. A collector terminal of the transistor Q2 is connected to a grounding terminal and connected to the same potential as that of the source terminal. The resistor Rbe is connected between a base terminal and the emitter terminal of the transistor Q2. The resistor Rcb is connected between the base terminal and the collector terminal of the transistor Q2. The resistor Rbe determines a current that flows through the resistor Rob. The resistor Rob determines a base potential of the transistor Q2.

An inductor Lstab is connected between the gate terminal of the transistor Q1 and the emitter terminal of the transistor Q2. An inductance value of the inductor $L_{stab}$ is set such that an impedance of the stabilizing circuit 1 side seen from the gate terminal of the transistor Q1 is sufficiently larger than an impedance of the transistor Q1 seen from the gate terminal of the transistor Q1 with respect to an operating frequency of the amplifier made up of the transistor Q1 so that the stabilizing circuit 1 may have substantially no effect on the amplification operation of the transistor Q1.

Next, operation of the stabilizing circuit 1 will be described. While a collector-emitter current of the transistor Q2 is flowing, a substantially constant voltage Vbe is generated between the base and the emitter of the transistor Q2. The voltage Vbe is substantially determined by a transistor material and is approximately 1.3 V for a GaAs-based material and approximately 0.8 V for an InP (indium phosphide)-based material at a room temperature. Since the voltage Vbe applies to both ends of the resistor Rbe, a constant current (Vbe÷Rbe) flows through the resistor Rbe according to Ohm's law. Since a current amplification factor of the transistor Q2 is normally as high as several tens to a hundred and several tens, the current flowing into the base terminal of the transistor Q2 can be mostly ignored and the substantially the same current as that flowing through the resistor Rbe flows through the resistor Rcb as well. For this reason, a voltage Vcb generated at both ends of the resistor Rcb becomes constant (Vbe÷Rbe×Rcb) according to Ohm's law. Thus, since a collector-emitter voltage Vce of the transistor Q2 is the sum of an emitter-base voltage Vbe and a base-collector voltage Vcb, Vce substantially becomes Vce≈Vbe×(Rcb÷Rbe+1). The stabilizing circuit 1 that operates Vce so as to be substantially constant is often called a "Vbe multiplier" and is often used in an integrated circuit as commonplace means for obtaining the collector voltage Vce of the transistor Q2 independent of a supply voltage.

A DC-like feature of this Vbe multiplier is as described above and the Vbe multiplier also has a feature of being low impedance as an AC-like feature as well. That is, an AC impedance in the direction of the collector terminal seen from the emitter terminal of the transistor Q2 shows a low impedance similar to an impedance of the transistor Q2 side seen from the emitter terminal when the transistor Q2 is operated as a normal emitter follower. The present embodiment uses the low impedance feature of the Vbe multiplier to achieve both a low bias current and a low impedance which is the problem to be solved.

Figure 2:
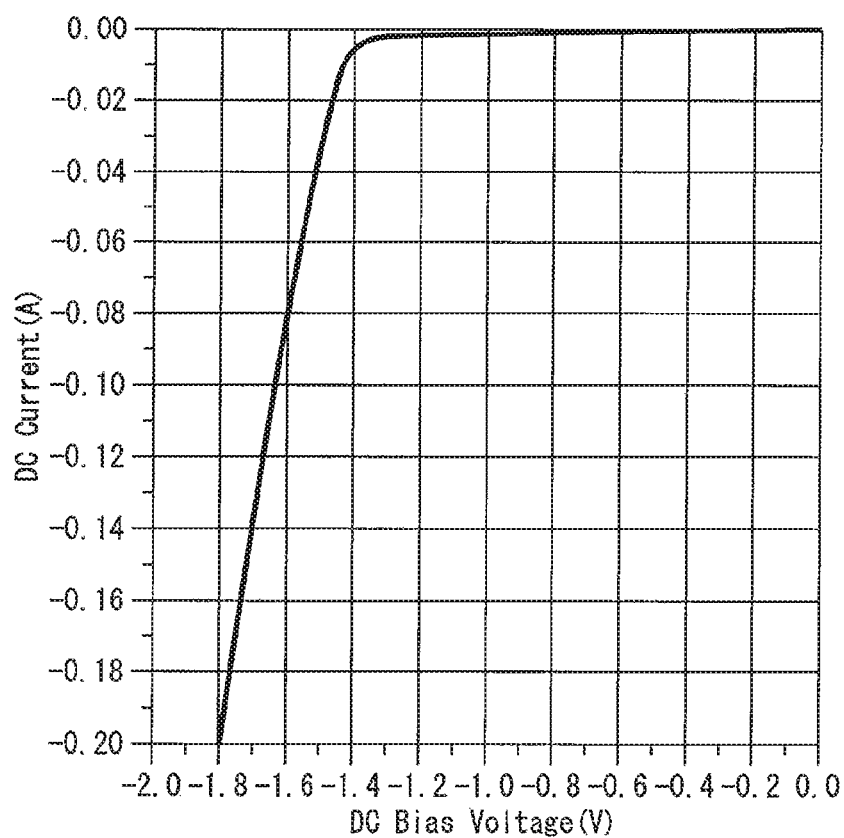
FIG. 2 is a diagram illustrating results of simulating a relationship between a DC voltage applied to the stabilizing circuit according to the first embodiment of the present invention and a flowing current.

FIG. 2 is a diagram illustrating results of simulating a relationship between a DC voltage applied to the stabilizing circuit according to the first embodiment of the present invention and a flowing current. In the present analysis, a GaAs transistor is used as the transistor Q2. The resistance of the resistor Rbe is assumed to be 800Ω, and the resistance of the resistor Rcb is assumed to be 75Ω. The stabilizing circuit 1 is characterized by allowing no current to flow at 0 V to −1.4 V and allowing a current to abruptly start flowing at a voltage of −1.4 V or below. Therefore, at the voltage of −1.4 V or below, the current moves a great deal in response to a micro change in the voltage, and therefore the resistance thereof can be deemed to be small for an unnecessary signal having small amplitude in an initial state in an oscillation mechanism.

Figure 3:
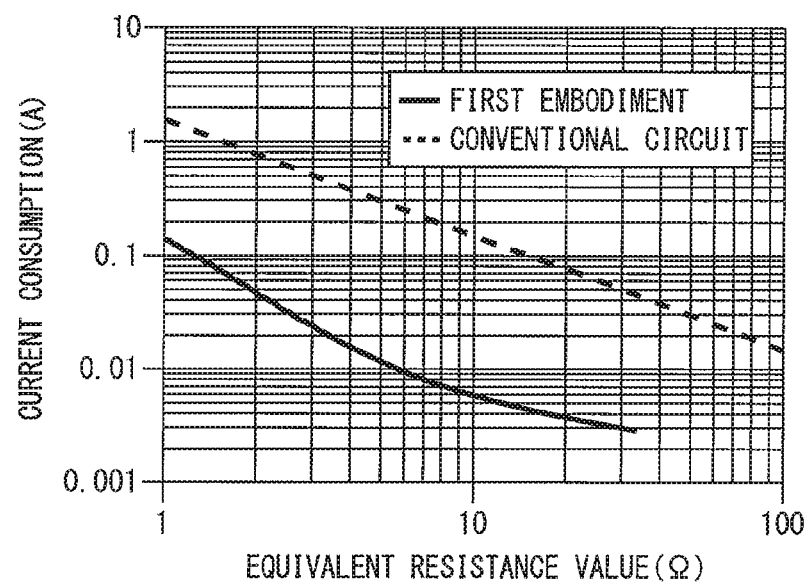
FIG. 3 is a diagram illustrating analysis results of a relationship between an equivalent resistance which can be considered with respect to a micro amplitude in the stabilizing circuit and current consumption.

FIG. 3 is a diagram illustrating analysis results of a relationship between an equivalent resistance which can be considered with respect to a micro amplitude in the stabilizing circuit and current consumption. −1.5 V is supplied as a gate bias. According to the analysis, the present embodiment can reduce current consumption to approximately ⅒ compared to the conventional circuit. For example, while the conventional circuit requires a current of 0.3 A or greater to obtain a resistance of 4Ω, the present embodiment can realize it with a current of 0.02 A or less. A breakdown of 0.02 A or less is as follows. When the current amplification factor of the transistor Q2 is assumed to be sufficiently high, it is possible to interpret that the current flowing through the resistor Rcb and the resistor Rbe of the Vbe multiplier is 1.5 V/(87Ω)≈0.017 A and 0.02−0.017≈0.03 A is the current that flows from the collector terminal to the emitter terminal of the transistor Q2.

Figure 4:
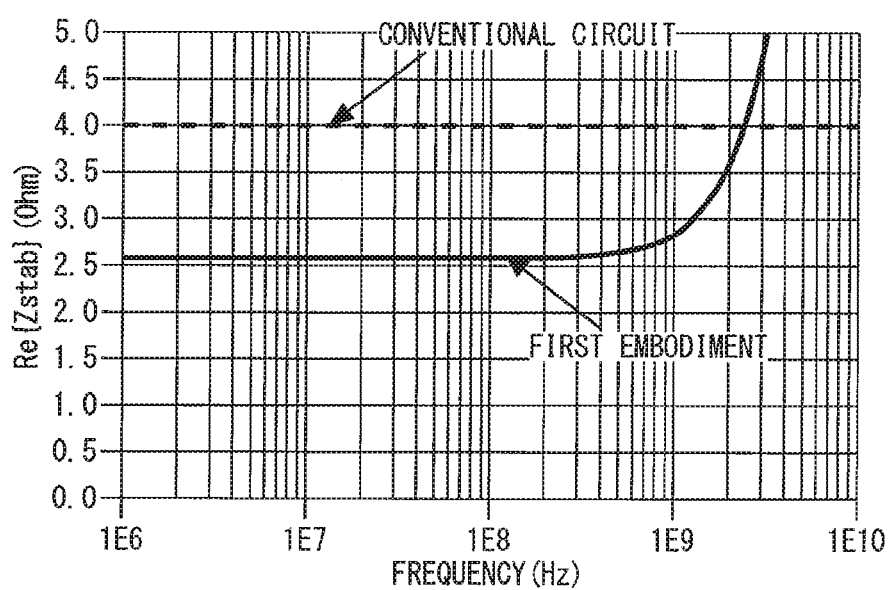
FIG. 4 is a diagram illustrating analysis results of a frequency characteristic of the real part of an input impedance of the stabilizing circuit according to the first embodiment of the present invention.

FIG. 4 is a diagram illustrating analysis results of a frequency characteristic of the real part of an input impedance of the stabilizing circuit according to the first embodiment of the present invention. A broken line shows an analysis result of the conventional circuit where the minimum necessary resistance $R_{stab}$ for stabilization is assumed to be 4Ω and a solid line shows an analysis result of the present embodiment in the case where −1.5 V necessary as the gate bias of the transistor Q1 at the corresponding resistance is applied. The conventional circuit shows a constant resistance independent of the frequency because it uses an ideal resistor. On the other hand, the present embodiment shows a constant resistance at approximately 1 GHz or below. Due to the low emitter resistance characteristic of the Vbe multiplier, a low impedance of approximately 2.6Ω which is still lower than that in the aforementioned case of the resistance of 4Ω (the current at this time is as large as 0.3 A) despite the low current of 0.02 A or below.

Figure 5:
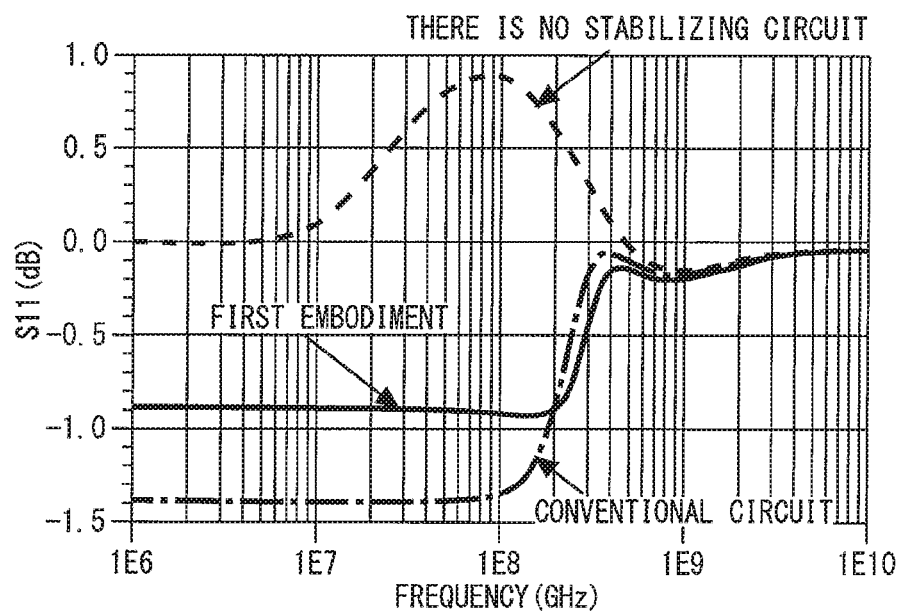
FIG. 5 is a diagram illustrating analysis results of an input-side reflection coefficient of the amplifier.

FIG. 5 is a diagram illustrating analysis results of an input-side reflection coefficient of the amplifier. It is seen in the present embodiment as in the case of the conventional circuit that the reflection coefficient is suppressed and stabilization can be achieved in a band from a little under 10 MHz to a little under 1 GHz.

Figure 6:
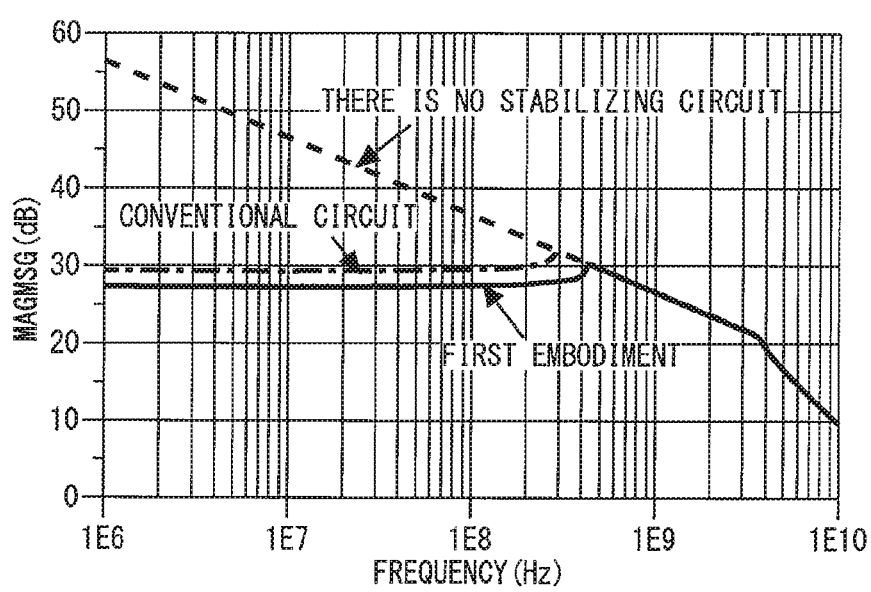
FIG. 6 is a diagram illustrating analysis results of MAG/MSG of the amplifier.

FIG. 6 is a diagram illustrating analysis results of MAG/MSG of the amplifier. It is seen that MAG/MSG is maintained from the case where the stabilizing circuit is not used, fulfilling the operation as the stabilizing circuit in 2.6 GHz which is a desired band of the present amplifier which has been calculated by way of example. Furthermore, in the present analysis, the current supplied by the gate bias circuit is approximately 0.03 A proving that it has been possible to reduce the current supplied by the gate-side power supply to approximately ⅒ while obtaining the same stabilization effect compared to the conventional circuit.

Figure 7:
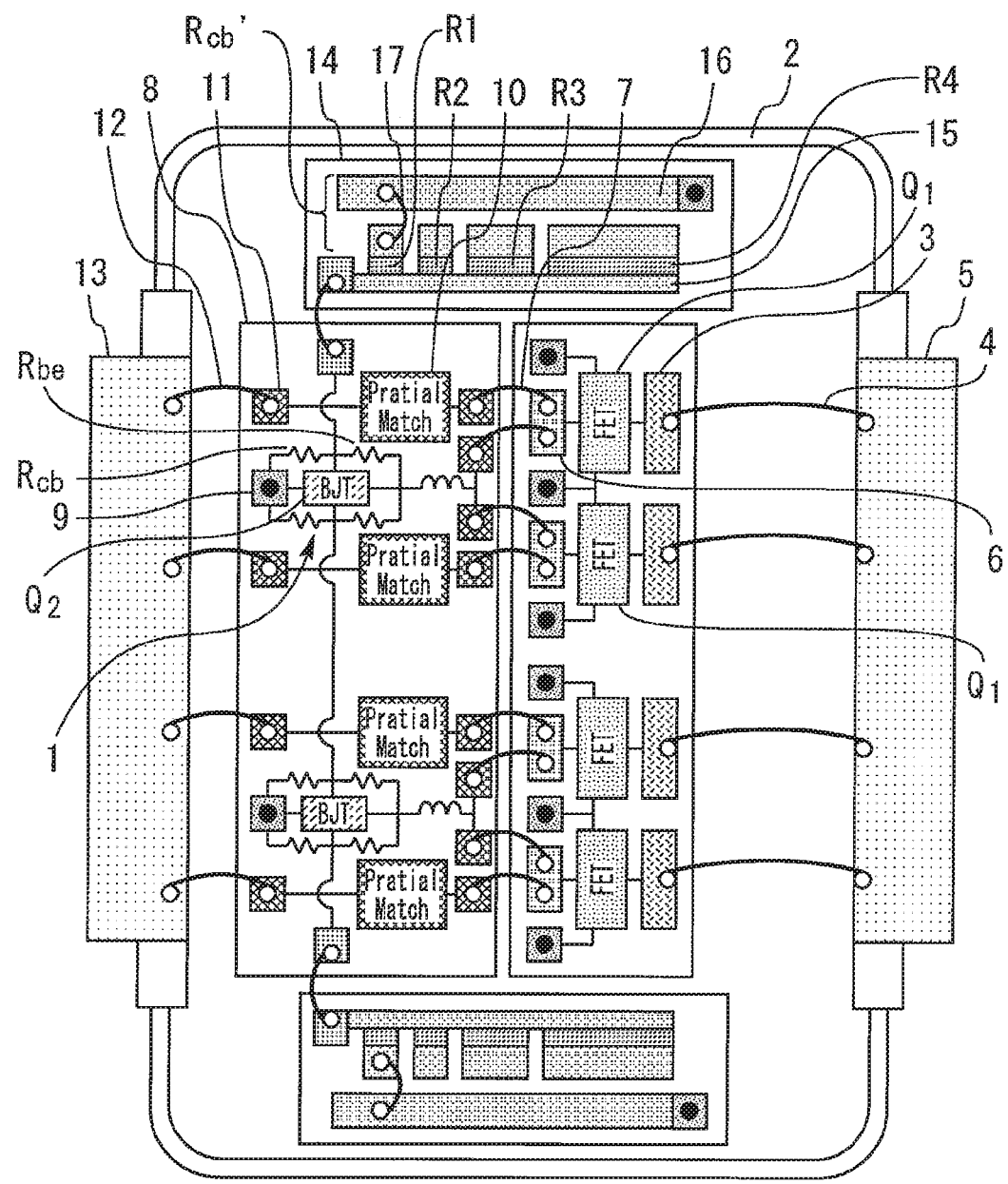
FIG. 7 is a diagram illustrating a layout when the semiconductor device according to the first embodiment of the present invention is applied to a high frequency amplifier.

FIG. 7 is a diagram illustrating a layout when the semiconductor device according to the first embodiment of the present invention is applied to a high frequency amplifier. The transistor Q1 and the transistor Q2 are accommodated in a single package 2. Four transistors Q1 are used to obtain large output power (corresponding to four components described as "FET" in FIG. 7). The four transistors Q1 are formed on a semiconductor substrate of GaN or the like and their respective source terminals are grounded. The drain terminal of the transistor Q1 is connected to a drain pad 3 and the drain pad 3 is connected to an output-side lead terminal 5 of the package 2 via a wire 4. A drain bias is supplied from the output-side lead terminal 5 and a signal amplified by the transistor Q1 is extracted. The gate terminal of the transistor Q1 is connected to a gate pad 6 and connected from the gate pad 6 to a semiconductor substrate 8 that forms a heterojunction bipolar transistor of GaAs or the like via a wire 7.

Two transistors Q2 are formed on the semiconductor substrate 8 and two transistors Q1 are connected to each one transistor Q2 (corresponding to two components described as "BJT" in FIG. 7). One transistor Q2 is provided for two transistors Q1 instead of four transistors Q1 is because this is an example of preventing loop oscillation. It is a matter of course that providing one transistor Q2 for one transistor Q1 can increase the effect of preventing loop oscillation, but this will also increase the demerit of increasing the chip size accordingly. The collector terminal of the transistor Q2 is connected to a grounding conductor on the rear surface of the substrate via a VIA hole 9 formed in the substrate. The resistor Rbe and the resistor Rcb are also formed on the semiconductor substrate 8. Moreover, a partial match circuit 10 is formed on the semiconductor substrate 8. The function of the present invention can be implemented without this circuit. However, a low-pass type circuit configuration (circuit configuration that transmits DC power) needs to be provided to implement the function of the present invention. A pad 11 of the semiconductor substrate 8 is connected to an input-side lead terminal 13 of the package 2 via a wire 12. A gate bias is applied from the input-side lead terminal 13 and an input signal is inputted.

Furthermore, a bias adjusting substrate 14 is formed in the package 2 for bias adjustment. The stabilizing circuit 1 has the characteristic shown in FIG. 2, allowing almost no current to flow up to a certain threshold voltage Vth (approximately −1.4 V in FIG. 2) and allowing a current to flow abruptly at a voltage of Vth or below. Low current consumption can be realized if a gate voltage Vgq (approximately −1.5 V in the present embodiment) necessary for the transistor Q1 is slightly lower than the threshold voltage Vth. However, the gate voltage Vgq generally involves individual differences, has a range of distribution of on the order of several tenths of V, which may result in a case where it is not possible to satisfy a condition that the gate voltage Vgq is slightly lower than the threshold voltage Vth. It is the bias adjusting substrate 14 that is the circuit for adjusting the threshold voltage Vth to satisfy the above-described low power consumption condition even if the gate voltage Vgq varies. The threshold voltage Vth generally follows the following expression.

$$Vth = Vbe \frac{Rbe + Rcb}{Rbe} \quad \text{[Expression 1]}$$

The resistor Rcb formed on the semiconductor substrate 8 and a resistor Rcb' as a variable resistor for bias adjustment are connected in parallel to make combined resistance (=Rcb×Rcb'/(Rcb+Rcb')) variable. Four resistors R1 to R4 formed of a resistive film are arranged on the top surface of the bias adjusting substrate 14 in the same electrode length. The four resistors R1 to R4 are each configured to have an electrode width twice that of the other, providing different resistances. One ends of the four resistors R1 to R4 are all connected by a metal thin-film 15. Pad electrodes are connected to the other unconnected ends of the four resistors R1 to R4 and an electrode 16 which is connected to a grounding potential is disposed at a position opposite to the pad electrodes. It is thereby possible to set whether or not to connect the pad electrodes of the four resistors R1 to R4 to the electrode 16 via a wire and ground them, and select a resistance from among 16 ways of values depending on the presence or absence of wire connections of the four resistors R1 to R4.

The resistance becomes lowest when all of the four resistors R1 to R4 are grounded via the wire 17 and the resistance becomes highest when all of the four resistors R1 to R4 are not grounded. It is preferable to design the resistor Rcb to allow the threshold voltage Vth to be set when the voltage takes the largest value in the negative direction that can be assumed within a range of variations of the gate voltage Vgq of the transistor Q1 and determine the resistance of the bias adjusting substrate 14 so as to ground all the resistors R1 to R4 on the bias adjusting substrate 14 when the voltage takes the smallest value in the negative direction that can be conceived within a range of variations of the gate voltage Vgq. For example, when coping with a variation of 0.2 V of the gate voltage Vgq, a 16-gradation threshold voltage Vth is obtained and it is thereby possible to adjust the bias within a range of approximately 0.013 V.

As described above, the present embodiment provides the Vbe multiplier which is a low frequency stabilizing circuit and the inductor which demonstrates a high impedance at an operating frequency between the gate terminal and the source terminal of the FET amplifier Q1. This makes it possible to prevent unnecessary low-frequency oscillation while keeping the gate bias current at a low level. As a result, it is possible to achieve both stability and low power consumption. Furthermore, using the Vbe multiplier created on the GaAs-based or InP-based semi-insulating substrate provides an effect that RF loss caused by the stabilizing circuit is small even when it is used in a GHz band.

Second Embodiment

Figure 8:
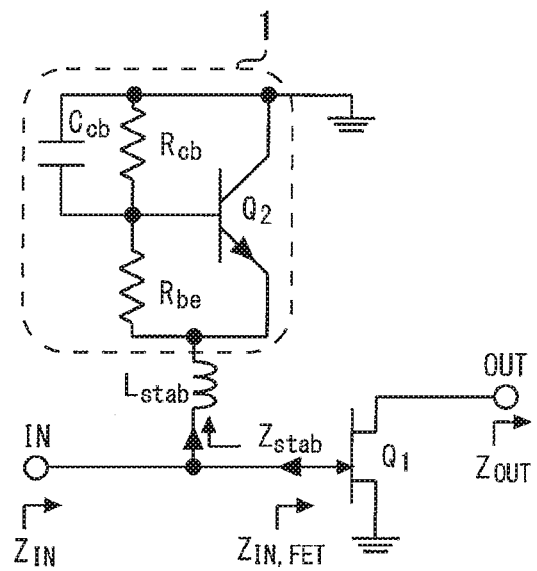
FIG. 8 is a diagram illustrating a semiconductor device according to a second embodiment of the present invention.

FIG. 8 is a diagram illustrating a semiconductor device according to a second embodiment of the present invention. The stabilizing circuit 1 of the present embodiment further includes a capacitor Ccb connected in parallel to the resistor Rcb between the base terminal and the collector terminal of the transistor Q2. The transistor Q2 and the capacitor Ccb are disposed on the single substrate.

In order for the stabilizing circuit 1 to keep a low impedance over a high frequency range, the transistor Q2 needs to cause an emitter current to flow at high speed. A base current needs to flow to cause the emitter current to flow. However, the speed is decreased in the first embodiment, because charge is supplied to the base terminal via the resistor Rcb or the resistor Rbe to cause the base current of the transistor Q2 to flow.

On the other hand, in the second embodiment, charge for causing the base current to flow is supplied from the charge (Vbe×Ccb) of the capacitor Ccb. This enables further stabilization at high frequencies (for an unnecessary signal of 1 GHz or higher) than the first embodiment. Furthermore, since the base current has a current amplification factor approximately one hundredth of that of the emitter current, only small charge is required, making it possible to achieve a low impedance with a relatively small capacity.

Figure 9:
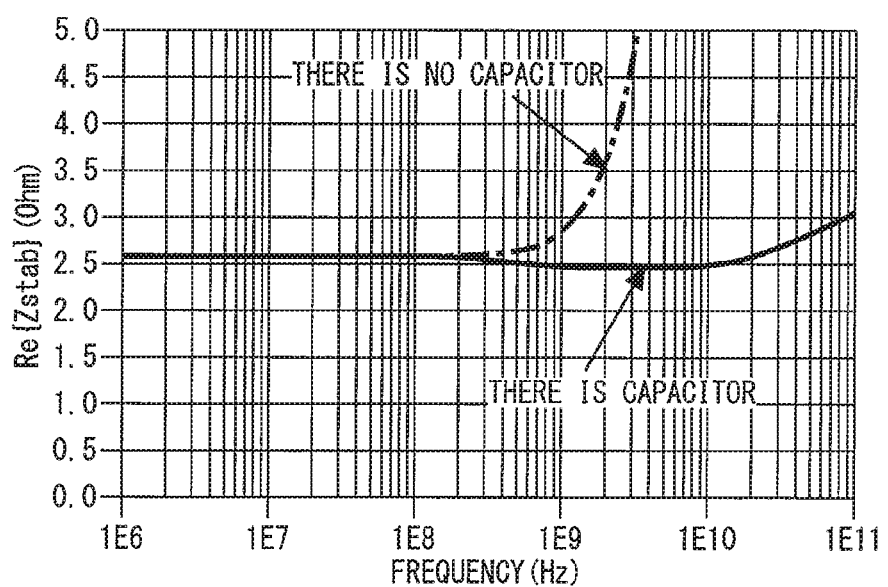
FIG. 9 is a diagram illustrating analysis results of the real part of the input impedance of the stabilizing circuit according to the second embodiment of the present invention.

FIG. 9 is a diagram illustrating analysis results of the real part of the input impedance of the stabilizing circuit according to the second embodiment of the present invention. The inclusion of the capacitor Ccb achieves a low impedance even in a high frequency region of 10 GHz or higher and provides a stabilization effect up to an extremely high frequencies. Note that in the analysis of FIG. 9, the capacity of the capacitor Ccb is 5 pF and the circuit area need not be increased.

As described above, the capacitor Ccb is connected in parallel to the base-collector resistor Rcb of the Vbe multiplier, and it is thereby possible to obtain an effect of providing a low impedance up to frequencies higher than those of the first embodiment.

Third Embodiment

Figure 10:
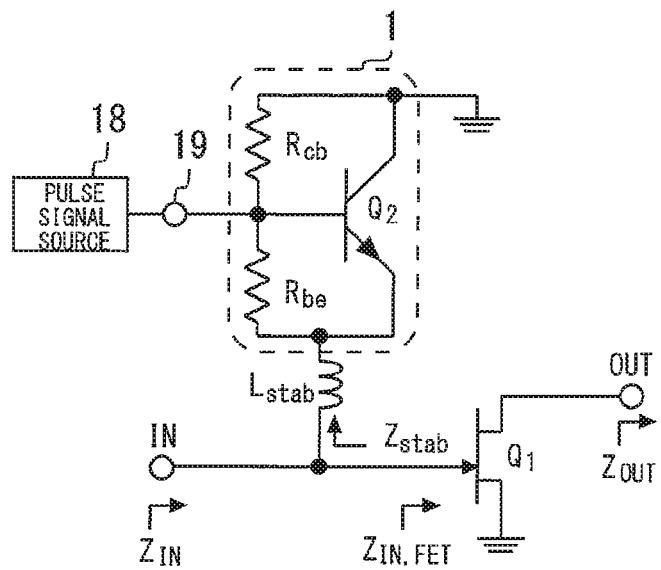
FIG. 10 is a diagram illustrating a semiconductor device according to a third embodiment of the present invention.

FIG. 10 is a diagram illustrating a semiconductor device according to a third embodiment of the present invention. In high frequency amplifiers used for radar or the like, a gate bias of an amplification FET may be set to equal to or less than a pinch-off voltage which is a gate voltage at which no drain current flows when signal amplification is not performed so as to limit the drain current that flows through the amplification FET and implement low power consumption.

In the circuit configurations of the first and second embodiments, when a gate pulse signal is directly applied from the input terminal IN, a current abruptly flows through the stabilizing circuit 1 at a voltage equal to or lower than the threshold voltage Vth, and it is therefore difficult to apply a voltage equal to or lower than the pinch-off voltage to the gate terminal of the transistor Q1. Although it is theoretically possible to lower an inner impedance of the pulse source so as to set the gate voltage to the pinch-off voltage, it is difficult to generate a pulse source with a low inner impedance.

Thus, the present embodiment connects a pulse signal source 18 that applies a pulse voltage to the base terminal of the transistor Q2 of the stabilizing circuit 1 via a connection terminal 19. This allows a gate signal voltage to be normally applied to the gate terminal of the transistor Q1.

Figure 11:
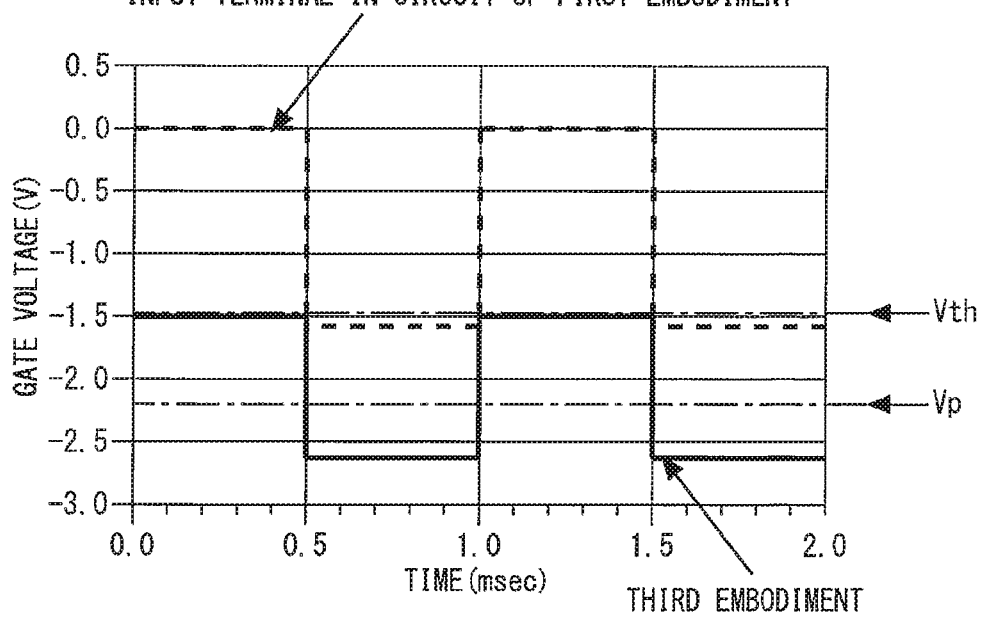
FIG. 11 is a diagram illustrating analysis results when pulses of 0 V and −5 V are given at a repetition period of 1 msec assuming that an inner impedance of the pulse signal source is 50Ω.

FIG. 11 is a diagram illustrating analysis results when pulses of 0 V and −5 V are given at a repetition period of 1 msec assuming that an inner impedance of the pulse signal source is 50. In the circuit of the first embodiment, when a pulse signal is applied from the input terminal IN, the gate voltage cannot be set to a voltage equal to or lower than the threshold voltage Vth. On the other hand, in the case of the present embodiment, a voltage equal to or lower than Vp is realized and the amplifier can be pulse-driven.

Fourth Embodiment

Figure 12:
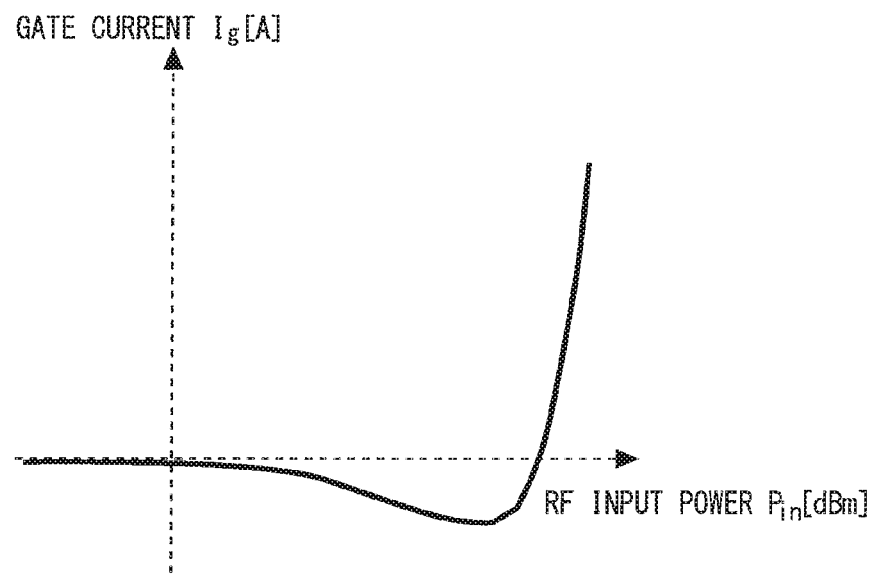
FIG. 12 is a diagram illustrating behavior of a gate current of a general depletion type FET with respect to RF input power.

When a gate leakage current of the transistor Q1 is negligibly small compared to the current flowing through the stabilizing circuit 1, the first to third embodiments perform functions effectively, but when the amount of gate leakage current is large, this becomes a problem. FIG. 12 is a diagram illustrating behavior of a gate current of a general depletion type FET with respect to RF input power. When the input power is low, the gate current flows extremely slightly from the gate to the power supply, the value of which is a negative value. When the input power increases, the current increases in a negative direction. When the input power is still higher, the gate current significantly increases toward a positive direction.

In the circuits of the first to third embodiments, the gate bias power supply operates to absorb the sum of the current from the gate terminal of the transistor Q1 and the current from the stabilizing circuit 1. When the input current increases and the gate current is outputted more, the increased current wraps around toward the stabilizing circuit 1. Of the current normally outputted from the stabilizing circuit 1 and the current pushed back by wraparound, the current outputted from the stabilizing circuit 1 decreases consequently. If the current outputted from the gate terminal of the transistor Q1 is greater than the current normally outputted from the stabilizing circuit 1, the current of the stabilizing circuit 1 is inverted. However, the current inverted by the polarity of the transistor Q2 cannot be made to flow into the stabilizing circuit 1 and the remaining current needs to be absorbed by the bias power supply on the gate side. When the current absorbed by the gate bias power supply fluctuates, a voltage drop by the resistance from the power supply to the transistor Q1 fluctuates, and so the gate voltage decreases (approximates to 0 V). Since the drop of the gate voltage causes the drain current to excessively increase, which is not desirable from the standpoint of achieving low power consumption.

Figure 13:
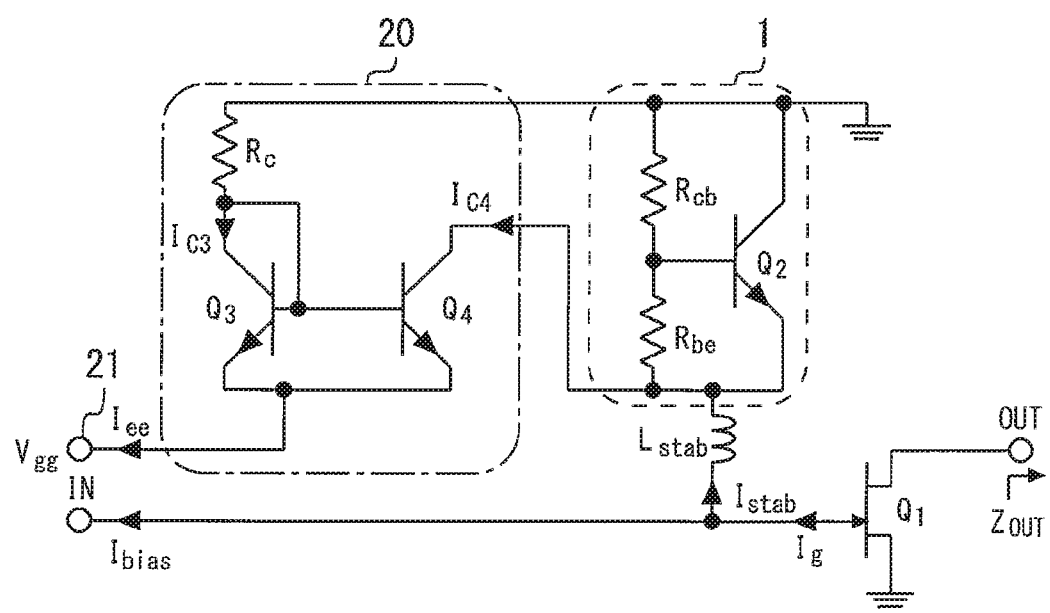
FIG. 13 is a diagram illustrating a semiconductor device according to a fourth embodiment of the present invention.

FIG. 13 is a diagram illustrating a semiconductor device according to a fourth embodiment of the present invention. The present embodiment corresponds to the circuit of the first embodiment to which a constant current circuit 20 is added. Note that the constant current circuit 20 may be added to the circuits of the second and third embodiments.

A constant current terminal of the constant current circuit 20 is connected to the emitter terminal of the transistor Q2.

The constant current circuit 20 includes transistors Q3 and Q4 which are NPN-type bipolar transistors, a resistor Rc and a negative voltage supply terminal 21 to which a negative voltage is supplied. The transistor Q3 creates a voltage that serves as a reference for a constant current. The transistor Q4 causes a constant current to flow. The resistor Rc creates a reference for the constant current.

An emitter area E3 of the transistor Q3 is smaller than an emitter area E4 of the transistor Q4. A base terminal of the transistor Q3 is connected to a collector terminal of the transistor Q3 and a base terminal of the transistor Q4. Since the base terminals of the transistors Q3 and Q4 are connected together, base-emitter voltages of both transistors are the same.

The emitter terminals of the transistors Q3 and Q4 are connected together and connected to the negative voltage supply terminal 21. Power necessary for the constant current circuit 20 is supplied from the negative voltage supply terminal 21. The resistor Rc is connected between the collector terminal of the transistor Q3 and a grounding terminal. A collector terminal of the transistor Q4 is connected to an emitter terminal of the transistor Q2 as a constant current terminal of the constant current circuit 20. A current flowing from the constant current circuit 20 is greater than a maximum gate current that can flow from the transistor Q1.

A voltage obtained by subtracting the base-emitter voltage of the transistor Q3 from a voltage Vgg applied to the negative voltage supply terminal 21 is added to the resistor Rc. Therefore, a current of (Vcc−Vbe)÷Rc flows through the resistor Rc. Part of this current also flows through the base terminals of the transistors Q3 and Q4, but if the base current is ignored because it is small, the current becomes substantially a collector current Ic3 of the transistor Q3. Since the collector current is proportional to the emitter area if the base-emitter voltage is the same, a collector current Ic4 of the transistor Q4 whose base-emitter voltage is the same as that of the transistor Q3 becomes Ic3×E4÷E3 and a constant current independent of the voltage of the transistor Q4 flows. Such a circuit configuration is called a "current mirror circuit."

The current outputted from the stabilizing circuit 1 and the gate current of the transistor Q1 are supplied from the constant current circuit 20. When input power of an input signal to the transistor Q1 increases and a large gate current is outputted, the current is supplied from the constant current circuit 20 as well. However, when the sum of the current outputted from the stabilizing circuit 1 and the current outputted from the transistor Q1 which has been increased by the input of the input signal exceeds the current of the constant current circuit 20, the excess current is outputted from the input terminal IN, and a voltage drop is generated by an inner resistance of the bias power supply, causing the gate voltage to fluctuate. Therefore, the current flowing from the constant current circuit 20 needs to be equal to or greater than the sum of the current necessary for the stabilizing circuit 1 and a maximum current that can be outputted when the transistor Q1 receives a desired input signal.

Fifth Embodiment

Figure 14:
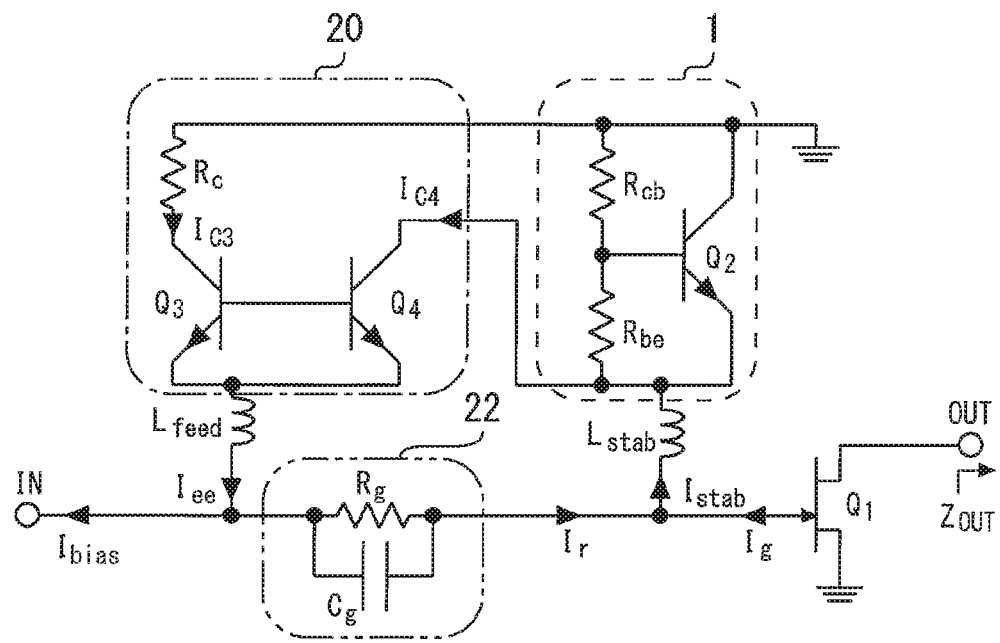
FIG. 14 is a diagram illustrating a semiconductor device according to a fifth embodiment of the present invention.

FIG. 14 is a diagram illustrating a semiconductor device according to a fifth embodiment of the present invention. The present embodiment corresponds to the circuit in the fourth embodiment to which a voltage generating circuit 22 is added. Furthermore, an inductor $L_{feed}$ is connected between the emitter terminals of the transistors Q3 and Q4, and the input terminal IN. The inductor $L_{feed}$ is a two-terminal circuit in which an impedance at a frequency of an input signal is greater than a reciprocal of a voltage differential value of a current flowing through the stabilizing circuit 1. Since the impedance of the inductor $L_{feed}$ increases at the frequency of the input signal, it is possible to prevent the input signal inputted to the input terminal IN from flowing into the constant current circuit 20.

The voltage generating circuit 22 is connected between the input terminal IN and the gate terminal, and includes a resistor Rg and a capacitor Cg which are connected parallel to each other. The resistor Rg generates a potential difference based on a direct current Ir and creates a gate bias from the voltage applied from the input terminal IN to drive the constant current circuit 20.

Since the input signal inputted from the input terminal IN would attenuate with the resistor Rg alone, the bypass capacitor Cg is used so that the input signal passes through the voltage generating circuit 22 without attenuation. The current Ir obtained by subtracting the current flowing from the stabilizing circuit 1 and a gate current Ig flowing from the transistor Q1 from the current flowing from the constant current circuit 20 flows into the resistor Rg. Thus, in order to produce a difference between a voltage Vbias biased from outside and a necessary gate voltage Vgq, the resistor Rg is set to (Vbias−Vgq)/Ir. Furthermore, the capacitor Cg may have a large value and may be selected so as to reduce the impedance at the frequency of the input signal and reduce attenuation by the resistor Rg. As a guideline for selecting the capacitor Cg, the impedance of the capacitor Cg at the frequency of the input signal is preferably smaller than the resistance of the resistor Rg.

The fourth embodiment requires the input terminal IN, the output terminal OUT and the negative voltage supply terminal 21 as external terminals. However, when a small semiconductor package is used, the number of terminals may be limited. In contrast, the present embodiment does not need the negative voltage supply terminal 21 as the external terminal, and can therefore reduce the number of external terminals of the semiconductor package.

Figure 15:
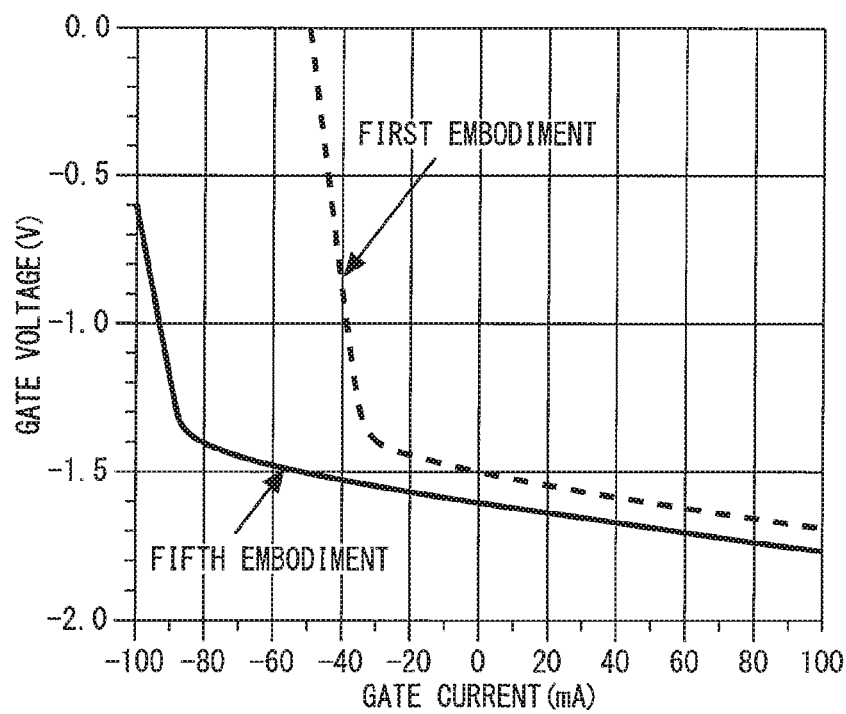
FIG. 15 is a diagram illustrating analysis results of a relationship between the gate current and the gate voltage of the circuits of the first and fifth embodiments.

It has been confirmed through a simulation that there is an effect of suppressing variations of the gate voltage when the gate current of the transistor Q1 increases. FIG. 15 is a diagram illustrating analysis results of a relationship between the gate current and the gate voltage of the circuits of the first and fifth embodiments. Compared to the first embodiment, the fifth embodiment can implement a constant gate voltage even when a greater negative gate current flows. Even in the case of the fifth embodiment, if a negative gate current of 90 mA or higher flows, the gate voltage changes abruptly. As described above, this is a case where the gate current exceeds the current flowing from the constant current circuit 20, and actual circuitry is designed, the system is designed such that the current flowing from the constant current circuit 20 exceeds the gate current that can flow from the transistor Q1. Furthermore, the current flowing from the gate-side power supply in the fifth embodiment is 0.1 A or below, which is ⅓ of the current value 0.3 A after performing stabilization through the conventional circuit described in the first embodiment.

Figure 16:
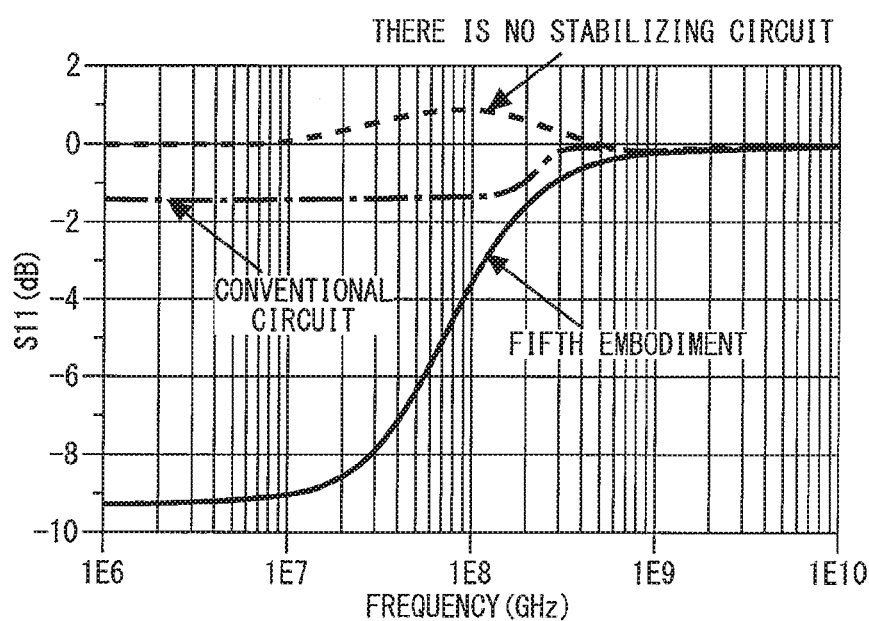
FIG. 16 is a diagram illustrating analysis results of an input-side reflection coefficient of the amplifier.
Figure 17:
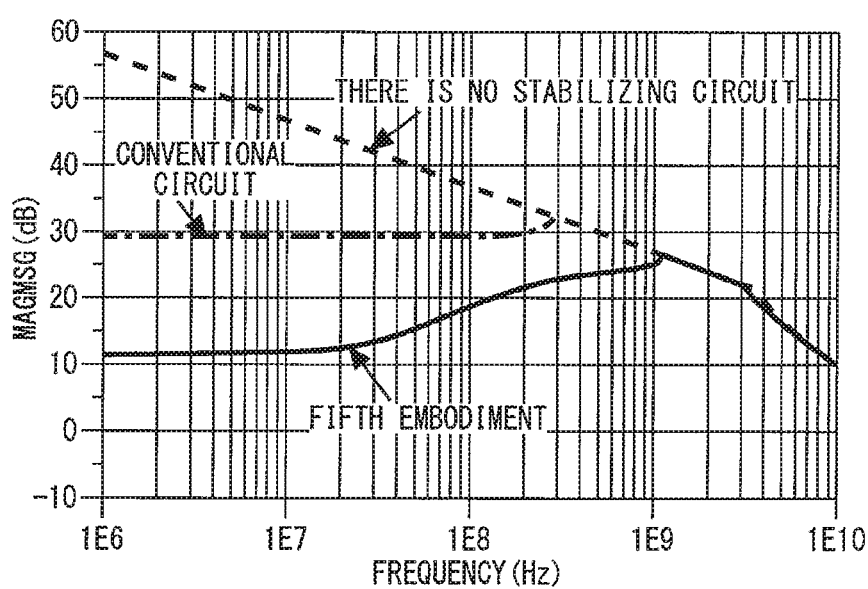
FIG. 17 is a diagram illustrating analysis results of MAG/MSG of the amplifier.

FIG. 16 is a diagram illustrating analysis results of an input-side reflection coefficient of the amplifier. It is seen that the reflection coefficient is stable without ever exceeding 0 dB at all frequencies. FIG. 17 is a diagram illustrating analysis results of MAG/MSG of the amplifier. It is seen that the fifth embodiment reduces MAG/MSG sufficiently at low frequencies (100 MHz or less), whereas it does not reduce MAG/MSG in a target design band. Thus, MAG/MSG at 100 MHz or below can be reduced because the voltage generating circuit 22 made up of the resistor Rg and the capacitor Cg connected in parallel passes only high frequency signals.

The first to fifth embodiments has adopted NPN-type transistors which can be implemented using compound semiconductors for all the bipolar transistors. Low loss can be thus achieved by adopting such a circuit configuration that can be implemented using a compound semiconductor, and it is therefore possible to mount the stabilizing circuit 1 within the same package as that of the transistor Q1.

Side effects of these embodiments will be described. The compound semiconductor has a feature of shorter electron running time in the collector. By implementing a bipolar transistor used for the stabilizing circuit 1 using a fast operating transistor (compound semiconductor), an effect of low distortion can be expected for fast modulated signals. With a signal modulated under a scheme such as quadrature amplitude modulation (QAM), the signal intensity changes over time. When a signal whose intensity changes over time is inputted to the transistor Q1, a time-varying gate current flows due to the relationship shown in FIG. 12. When broken down to frequencies, the time-varying gate current has components up to high frequencies. Modulation frequencies tend to increase in recent years, reaching several tens of MHz to even several hundreds of MHz. Since the stabilizing circuit 1 realizes low impedance characteristics up to high frequencies, even when the gate current includes a high frequency component, it is possible to keep the gate voltage constant. It is desirable to suppress a fluctuation in the gate voltage because this causes a fluctuation of a bias point, thereby causing distortion characteristics to deteriorate.

Figure 18:
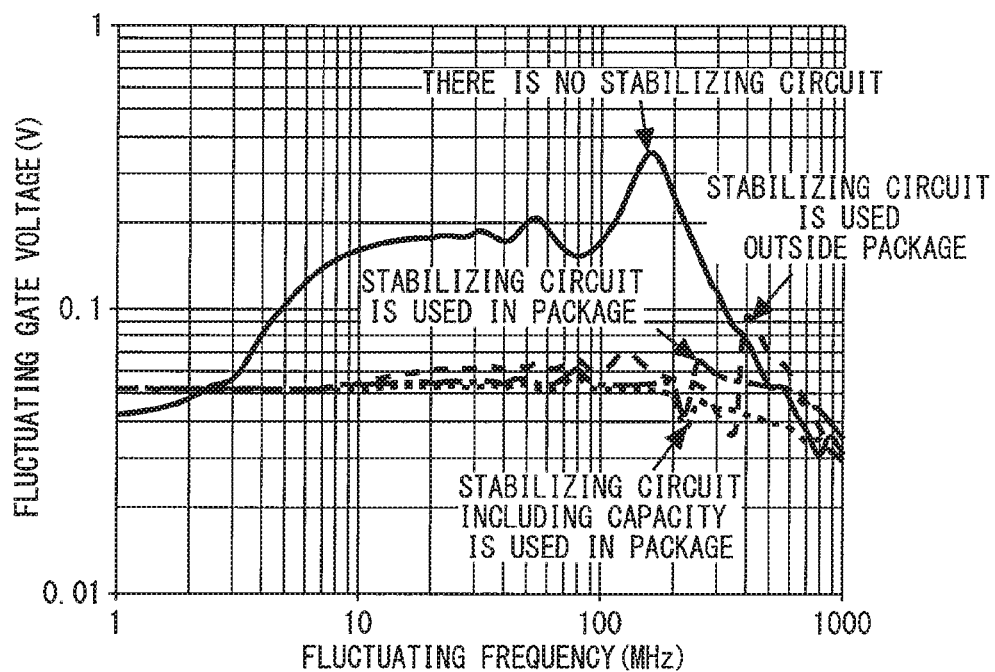
FIG. 18 is a diagram illustrating calculation results of fluctuating frequency dependency of a fluctuating gate voltage.
Figure 19:
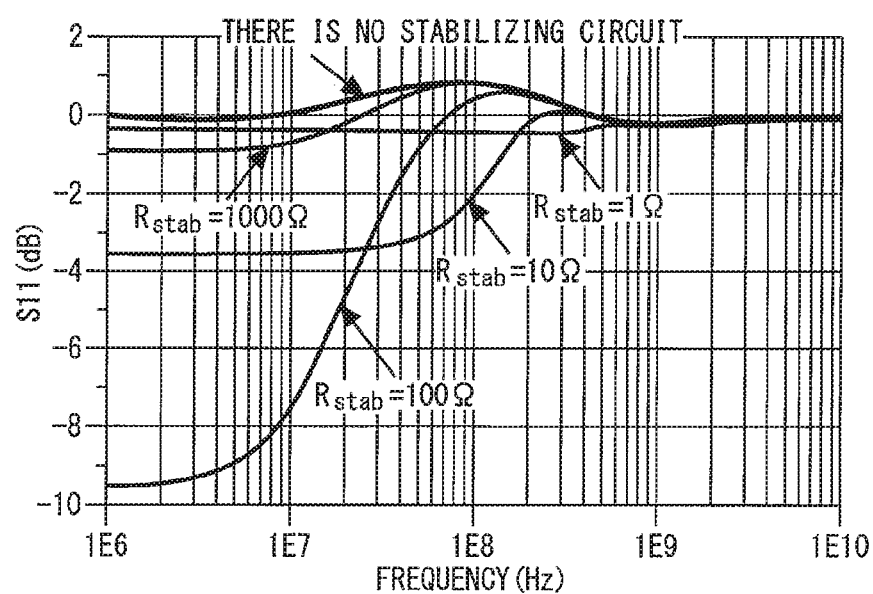
FIG. 19 is a diagram illustrating a frequency characteristic of a reflection coefficient on the transistor side including the conventional stabilizing circuit.
Figure 20:
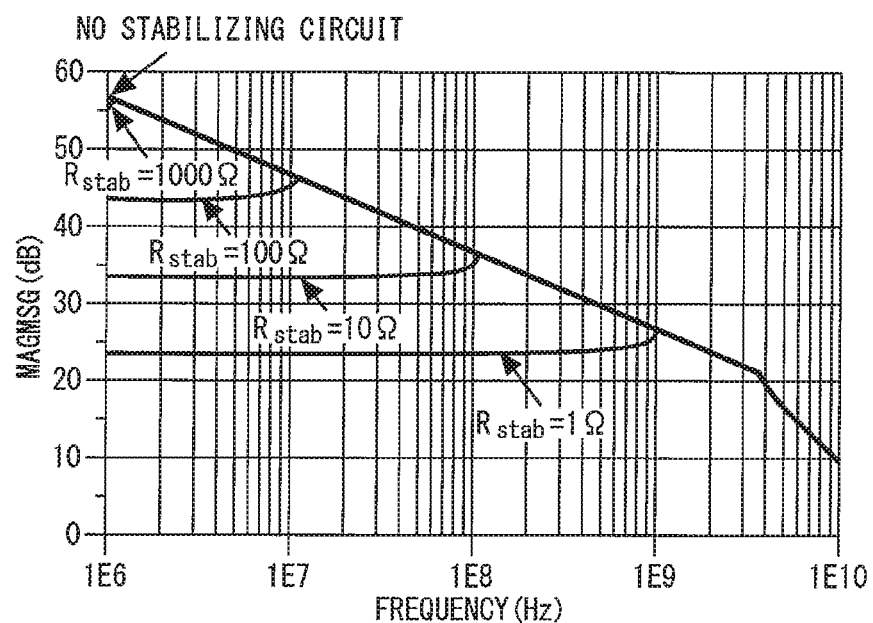
FIG. 20 is a diagram illustrating a frequency characteristic of a maximum available gain & maximum stable gain (MAG/MSG) that can be achieved for stabilization of a transistor including the conventional stabilizing circuit.
Figure 21:
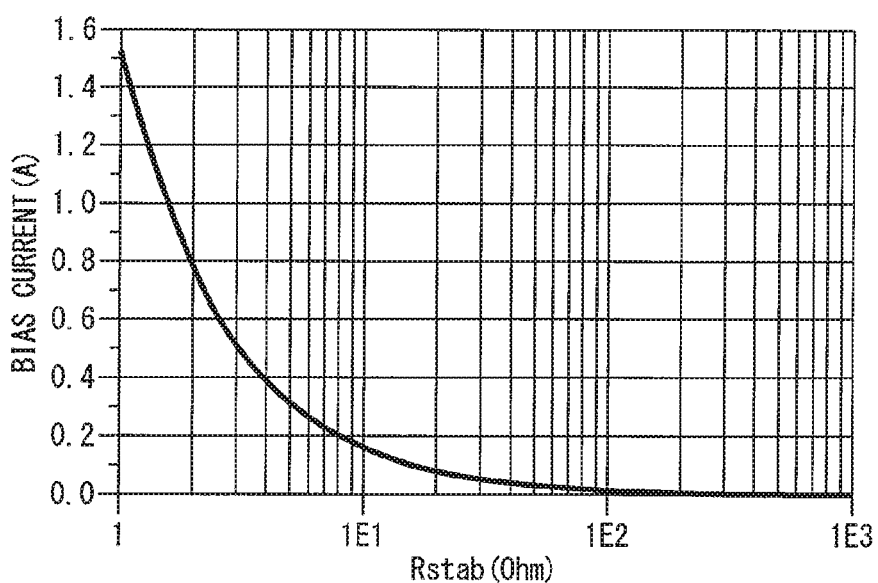
FIG. 21 is a diagram illustrating a relationship of a bias current supplied by a gate-side power supply with respect to resistance of the transistor including the conventional stabilizing circuit.
Figure 22:
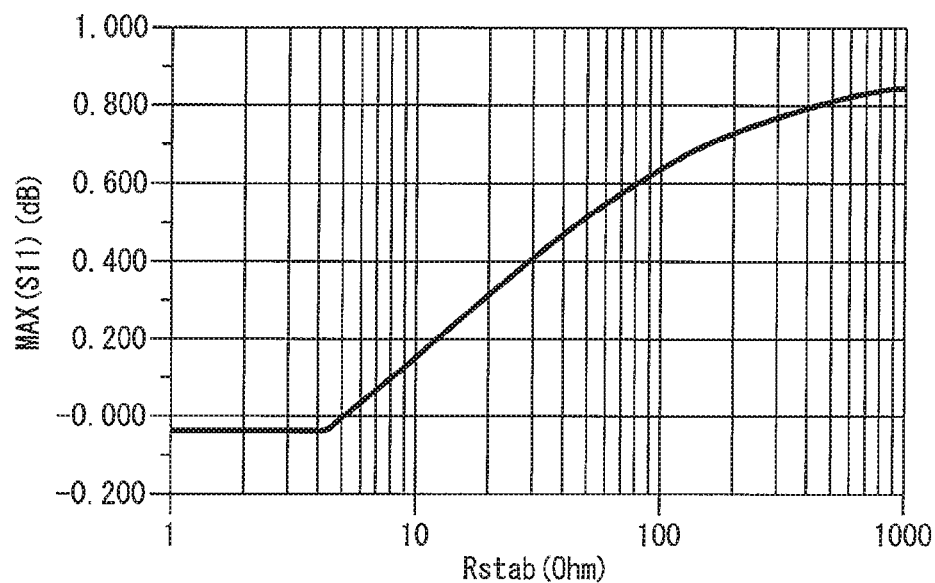
FIG. 22 is a diagram summarizing a relationship of a maximum value of a reflection coefficient with respect to each resistance in FIG. 19.
Figure 23:
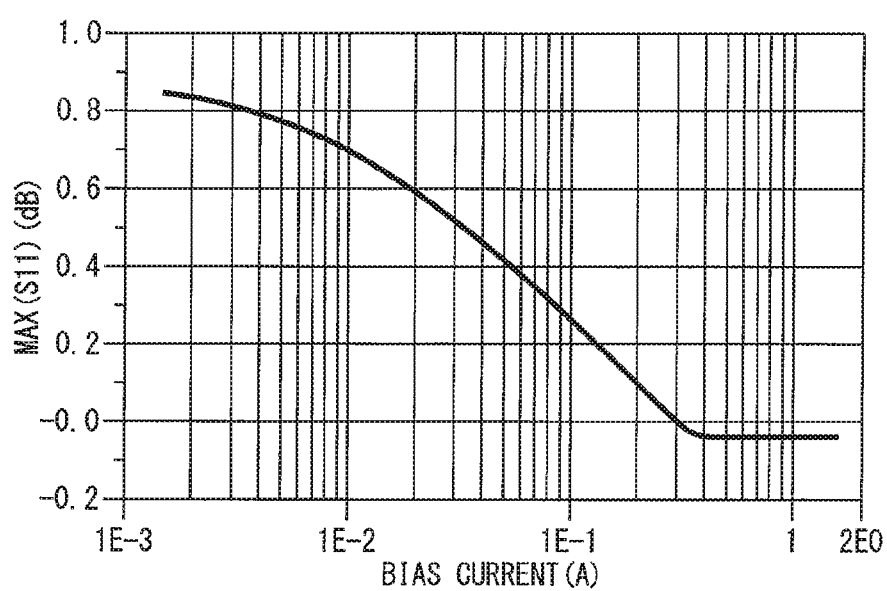
FIG. 23 is a diagram illustrating a relationship of a maximum value of a reflection coefficient with respect to a bias current obtained from the relationship between the maximum value of the reflection coefficient at each resistance and the bias current at each resistance in FIG. 19.

FIG. 18 is a diagram illustrating calculation results of fluctuating frequency dependency of a fluctuating gate voltage. A maximum value (peak value) of time variation of the gate voltage when the gate current of the transistor Q1 changes over time by input power from −10 mA to +10 mA is calculated while changing the fluctuation cycle. When there is no stabilizing circuit 1, a low impedance cannot be obtained by the bias circuit and the matching circuit, the amount of change of the gate voltage increases as the frequency increases from on the order of 3 MHz to high frequencies and a variation of a maximum of a little under 0.4 V occurs. When the stabilizing circuit 1 is used outside the package, the variation in the gate voltage is reduced considerably compared to the case where there is no stabilizing circuit 1. However, even when the stabilizing circuit 1 is mounted outside the package, the variation is gradually worsened from 10 MHz. Furthermore, the fluctuation in the gate voltage abruptly increases at a frequency on the order of 400 MHz. This is attributable to a resonance phenomenon associated with the inductance of the route from the stabilizing circuit 1 to the transistor Q1 and the gate capacity of the transistor Q1. When the stabilizing circuit 1 is placed in proximity to the transistor Q1 in the package, the amount of change can be reduced even at 10 MHz or higher. When the stabilizing circuit 1 is mounted in the package and the capacity (10 pF) of the second embodiment is added to the stabilizing circuit 1, a low impedance is further implemented at frequencies of 100 MHz or higher, and therefore the fluctuation in the gate voltage is further corrected.

Note that the above-described first to fifth embodiments have shown nothing but most basic amplifiers as an example of the semiconductor device, and the present invention is a technique generally applicable to semiconductor devices including oscillators or mixers or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-215710, filed on Nov. 2, 2015 including specification, claims, drawings and summary, on which the Convention priority of the present application is based, is incorporated herein by reference in its entirety.

The invention claimed is:

1. A semiconductor device comprising:
   a depletion-type field-effect transistor including a gate terminal, a drain terminal and a source terminal;
   a group III-V heterojunction bipolar transistor including a base terminal, an emitter terminal electrically connected to the gate terminal and a collector terminal connected to the same potential as that of the source terminal;
   a first resistor connected between the base terminal and the emitter terminal; and
   a second resistor connected between the base terminal and the collector terminal.

2. The semiconductor device of claim 1, further comprising an inductor connected between the gate terminal and the emitter terminal.

3. The semiconductor device of claim 1, further comprising a first capacitor connected in parallel to the second resistor between the base terminal and the collector terminal.

4. The semiconductor device of claim 3, wherein the bipolar transistor and the first capacitor are disposed on a single substrate.

5. The semiconductor device of claim 1, wherein the field-effect transistor and the bipolar transistor are accommodated in a single package.

6. The semiconductor device of claim 1, wherein the field-effect transistor includes a plurality of field-effect transistors, and one bipolar transistor is connected to one or two of the field-effect transistors.

7. The semiconductor device of claim 1, further comprising a variable resistor connected in parallel to the second resistor.

8. The semiconductor device of claim 7, wherein the variable resistor includes a plurality of resistors having different resistances, and
   a resistance of the variable resistor is selected by a presence or absence of wire connections of the plurality of resistors.

9. The semiconductor device of claim 1, further comprising a pulse signal source applying a pulse voltage to the base terminal of the bipolar transistor.

10. The semiconductor device of claim 1, further comprising a constant current circuit having a constant current terminal connected to the emitter terminal of the bipolar transistor.

11. The semiconductor device of claim 10, wherein a current flowing from the constant current circuit is greater than a maximum gate current flowing from the field-effect transistor.

12. The semiconductor device of claim 10, wherein the constant current circuit includes first and second bipolar transistors of NPN-type and a third resistor,
   an emitter area of the first bipolar transistor is smaller than an emitter area of the second bipolar transistor,
   a base terminal of the first bipolar transistor is connected to a collector terminal of the first bipolar transistor and a base terminal of the second bipolar transistor,
   emitter terminals of the first and second bipolar transistors are connected together,
   a negative voltage is supplied to the emitter terminals of the first and second bipolar transistors,
   the third resistor is connected to the collector terminal of the first bipolar transistor, and
   a collector terminal of the second bipolar transistor is connected to the emitter terminal of the bipolar transistor as the constant current terminal of the constant current circuit.

13. The semiconductor device of claim 12, further comprising:
   an input terminal;
   a two-terminal circuit connected between the emitter terminals of the first and second bipolar transistors and the input terminal and in which an impedance at a frequency of an input signal inputted to the input terminal is greater than a reciprocal of a voltage differential value of a current flowing through the bipolar transistor; and
   a voltage generating circuit connected between the input terminal and the gate terminal and generating a potential difference based on a direct current,
   wherein the input signal passes through the voltage generating circuit.

14. The semiconductor device of claim 13, wherein the voltage generating circuit includes a fourth resistor and a second capacitor which are connected parallel to each other,
   wherein impedance of the second capacitor at a frequency of the input signal is smaller than a resistance of the fourth resistor.

15. The semiconductor device of claim 1, wherein the bipolar transistor is made of a compound semiconductor.

16. The semiconductor device of claim 15, wherein the first resistor and the bipolar transistor are disposed on a single substrate.

* * * * *